(12) United States Patent
Xiang

(10) Patent No.: US 10,847,589 B2
(45) Date of Patent: Nov. 24, 2020

(54) OLED DISPLAY PANEL AND METHOD FOR MANUFACTURING SAME

(71) Applicant: Wuhan China Star Optoelectronics Semiconductor Display Technology Co., Ltd., Wuhan (CN)

(72) Inventor: Ming Xiang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 58 days.

(21) Appl. No.: 16/325,402

(22) PCT Filed: Oct. 11, 2018

(86) PCT No.: PCT/CN2018/109914
§ 371 (c)(1),
(2) Date: Feb. 14, 2019

(87) PCT Pub. No.: WO2020/034376
PCT Pub. Date: Feb. 20, 2020

(65) Prior Publication Data
US 2020/0185466 A1    Jun. 11, 2020

(30) Foreign Application Priority Data

Aug. 13, 2018 (CN) .......................... 2018 1 0914966

(51) Int. Cl.
*H01L 27/32*      (2006.01)
*H01L 51/52*      (2006.01)
(Continued)

(52) U.S. Cl.
CPC ...... *H01L 27/3246* (2013.01); *H01L 27/3258* (2013.01); *H01L 51/5253* (2013.01);
(Continued)

(58) Field of Classification Search
CPC . H01L 51/5253; H01L 27/3246; H01L 51/56; H01L 27/3258; H01L 27/1248; H01L 2227/323
See application file for complete search history.

(56) References Cited

U.S. PATENT DOCUMENTS 9,401,391 B2 *   7/2016   Kim ................... H01L 27/3223
10,268,299 B2 *  4/2019   Watanabe .............. G06F 3/044
(Continued)

FOREIGN PATENT DOCUMENTS

CN    106591776    4/2017
CN    107731888    2/2018
CN    108321176    7/2018

*Primary Examiner* — Savitri Mulpuri

(57) ABSTRACT

A method for manufacturing an OLED display panel is provided. The method includes steps of providing an array substrate; forming an OLED function layer including a first common layer, an organic light-emitting layer, and a second common layer on the array substrate; forming a first opening at a location near to the organic light-emitting layer using a first laser; forming a thin-film encapsulation layer on the OLED function layer; forming a second opening at a location corresponding to the first opening using a dry etching technique, the second opening passing through an inorganic layer of the thin-film encapsulation layer and at least one inorganic layer of the array substrate, and being connected to the first opening; and forming a perforated hole in the substrate at a location corresponding to the second opening using a second laser, thereby producing a through-hole in the OLED display panel.

10 Claims, 2 Drawing Sheets

(51) Int. Cl.
*H01L 51/56* (2006.01)
*H01L 27/12* (2006.01)

(52) U.S. Cl.
CPC .......... *H01L 51/56* (2013.01); *H01L 27/1248* (2013.01); *H01L 2227/323* (2013.01)

(56) References Cited

U.S. PATENT DOCUMENTS

| | | |
|---|---|---|
| 10,401,696 B2 * | 9/2019 | Watanabe .............. H05K 3/366 |
| 2008/0118743 A1 | 5/2008 | Lee et al. |
| 2014/0134763 A1 * | 5/2014 | Park ................... H01L 51/0014 438/26 |
| 2017/0148826 A1 * | 5/2017 | Choi ................... H01L 27/1218 |
| 2017/0237038 A1 | 8/2017 | Kim et al. |
| 2018/0355466 A1 | 12/2018 | Mu |

* cited by examiner

OLED DISPLAY PANEL AND METHOD FOR MANUFACTURING SAME

RELATED APPLICATIONS

This application is a National Phase of PCT Patent Application No. PCT/CN2018/109914 having International filing date of Oct. 11, 2018, which claims the benefit of priority of Chinese Patent Application No. 201810914966.4 filed on Aug. 13, 2018. The contents of the above applications are all incorporated by reference as if fully set forth herein in their entirety.

FIELD AND BACKGROUND OF THE INVENTION

The present disclosure relates to the field of organic light-emitting diode (OLED) screen, and more particularly to an OLED display panel and a method for manufacturing same.

Among different types of flat panels, organic light-emitting diode (OLED) displays have outstanding properties, including being light weight, thin, self-illuminating, short response times, wide viewing angles, a wide color gamut, high brightness, and low power consumption. Thus, succeeding liquid crystal displays (LCDs), OLED displays have gradually become a third generation display technology. Compared to LCDs, OLED displays save more energy, are thinner, and have wider viewing angles, to which the LCDs cannot compete.

Laser cutting is a technique to have OLED display screens have more diverse appearances. Laser cutting could be used to form U-shapes at peripheral edges of display screens, or to form streamlined curves at corners of display screens. In addition, laser cutting could be used to form through-holes in display areas of OLED display screens, into which front cameras, distance sensors, or microphones are intended to be disposed and fitted, so as to increase screen-to-body ratio of screens, and to provide users with more artistic visual sensation.

Currently, there are two techniques to achieve encapsulation of organic light-emitting unit in OLED display screens. One is fine metal mask (FMM), which utilizes deposition to form common layers of organic light-emitting unit. The other relates to formation of pixel defining layer that has an inverse trapezoid structure. Both the two techniques involve using thin film encapsulation layer to encapsulate organic light-emitting unit in each pixel, and thus avoid encapsulation failure. However, both the two techniques require use of many FMMs or require additional steps for manufacturing substrate, thus increasing production difficulty and increasing producing cost.

Therefore, there is a need to provide a method for forming through-hole in display areas of flexible OLED display screens, in order to solve above-said problems existing in prior art.

SUMMARY OF THE INVENTION

The present disclosure provides an organic light-emitting diode (OLED) display panel and a method for manufacturing same, which solve the manufacturing difficulty problem and high producing cost problem that exist in the prior art.

To solve the aforementioned problems, the present disclosure provides a method for manufacturing an organic light-emitting diode (OLED) display panel, comprising steps of:

providing an array substrate, wherein the array substrate includes a baseplate, and at least one inorganic layer, an organic planarization layer, and a pixel defining layer sequentially formed on the baseplate from bottom to top;

forming an OLED function layer on the array substrate, wherein the OLED function layer includes a first common layer, an organic light-emitting layer, and a second common layer sequentially formed on the array substrate from bottom to top;

forming a first opening at a location near to the organic light-emitting layer using a first laser, such that the first opening passes through the second common layer, the first common layer, the pixel defining layer, and the organic planarization layer of the array substrate;

forming a thin-film encapsulation layer on the OLED function layer, wherein an inorganic layer of the thin-film encapsulation layer completely covers the organic light-emitting layer;

forming a second opening at a location corresponding to the first opening using a dry etching technique, such that the second opening passes through the inorganic layer of the thin-film encapsulation layer and passes through the at least one inorganic layer of the array substrate, and the second opening is connected to the first opening; and forming a perforated hole in the baseplate at a location corresponding to the second opening using a second laser, thereby producing a through-hole in the OLED display panel.

In one preferred embodiment of the present disclosure, the baseplate is a polyimide baseplate.

In one preferred embodiment of the present disclosure, all of the second common layer, the organic light-emitting layer, the first common layer, the pixel defining layer, and the organic planarization layer are made of organic material.

In one preferred embodiment of the present disclosure, the method further comprises:

forming a thin film transistor (TFT) device on the baseplate.

In one preferred embodiment of the present disclosure, the first common layer includes a hole injection layer and a hole transportation layer sequentially formed from bottom to top; and the second common layer includes an electron transportation layer, an electron injection layer, and an cathode sequentially formed from bottom to top.

In one preferred embodiment of the present disclosure, the first common layer, the organic light-emitting layer, and the second common layer are formed using deposition techniques; and the thin film encapsulation layer is formed using a chemical vapor deposition technique.

The present disclosure further provides an organic light-emitting diode (OLED) display panel, comprising:

an array substrate, wherein the array substrate includes a baseplate, and at least one inorganic layer, an organic planarization layer, and a pixel defining layer sequentially disposed on the baseplate from bottom to top;

an OLED function disposed on the array substrate, wherein the OLED function layer includes a first common layer, an organic light-emitting layer, and a second common layer sequentially disposed on the array substrate from bottom to top;

a thin-film encapsulation layer disposed on the OLED function layer, wherein an inorganic layer of the thin-film encapsulation layer completely covers the organic light-emitting layer; and a through-hole disposed at a location near to the organic light-emitting layer, wherein the through-hole passes through the inorganic layer of the thin-film encapsulation layer, the at least one inorganic layer of the array substrate, and the baseplate of the array substrate.

In one preferred embodiment of the present disclosure, the baseplate is a polyimide baseplate.

In one preferred embodiment of the present disclosure, all of the second common layer, the organic light-emitting layer, the first common layer, the pixel defining layer, and the organic planarization layer are made of organic material.

In one preferred embodiment of the present disclosure, the first common layer includes a hole injection layer and a hole transportation layer sequentially disposed from bottom to top; and the second common layer includes an electron transportation layer, an electron injection layer, and an cathode sequentially disposed from bottom to top.

The present disclosure provides a method for manufacturing an organic light-emitting diode (OLED) display panel, which includes using deposition techniques to form the first common layer, the organic light-emitting layer, and the second common layer first. Next, a first laser is used to form the first opening in those layers made of organic material. Then, a deposition technique is used to form the thin film encapsulation layer on the substrate. Thereafter, a dry etching technique is used to form the second opening in those layers made of an inorganic layer. Finally, a second laser is used to form the perforated hole in the baseplate. Thereby, the through-hole that includes the first opening, the second opening, and the perforated hole is produced in the OLED display panel. The subject invention ensures that the organic light-emitting layer is completely covered by the inorganic layers of the thin film encapsulation layer, and thus encapsulation failure does not occur. Therefore, according to the present disclosure, laser cutting and drilling is used and one additional dry etching step is further included in order to form a through-hole in the display panel. The manufacturing process of the present disclosure is simple.

DESCRIPTION OF SPECIFIC EMBODIMENTS OF THE INVENTION

Figure 1:
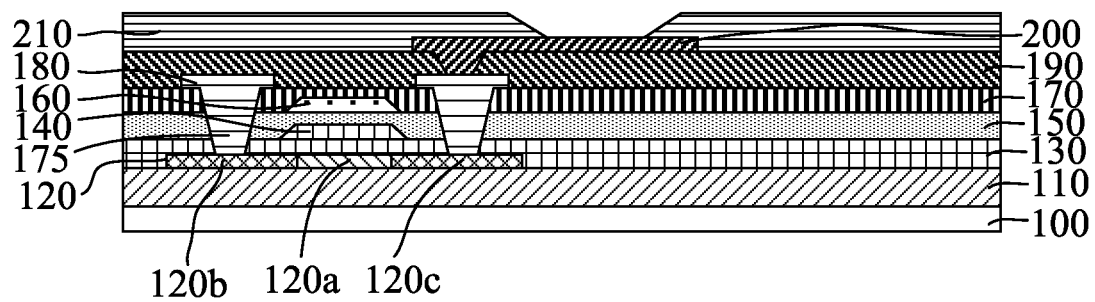
FIGS. 1, 2, 3, 4, 5, and 6 show a process flow of a method for manufacturing an organic light-emitting diode (OLED) display panel according to one preferred embodiment of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Please refer to FIGS. 1-6, which show a process flow of a method for manufacturing an organic light-emitting diode (OLED) display panel according to one preferred embodiment of the present disclosure. The method includes the following steps.

First, as shown in FIG. 1, an array substrate is provides. The array substrate includes a baseplate 100, and at least one inorganic layer, an organic planarization layer 109, and a pixel defining layer 210 sequentially formed on the baseplate from bottom to top. Preferably, the baseplate 100 is made of an organic material. For example, the base plate 100 is a polyimide baseplate.

Preferably, the method further includes forming a thin film transistor (TFT) device on the baseplate 100, which specifically, includes steps of:

depositing a buffer layer 110 on the baseplate 100;

depositing a polysilicon layer 120 on the buffer layer 110, and patterning the polysilicon layer 120;

performing a heavy doping treatment on two sides of the polysilicon layer 120, so as to form two heavily doped areas 120b and 120c;

depositing a first gate insulation layer 130 on the polysilicon layer 120;

depositing a first metal gate layer 140 on the first gate insulation layer 130, and patterning the first metal gate layer 140;

depositing a second gate insulation layer 150 on the first metal gate layer 140;

depositing a second metal gate layer 160 on the second gate insulation layer 150, and patterning the second metal gate layer 160;

depositing an interlayer dielectric (ILD) layer 170 on the second metal gate layer 160;

forming an interlayer connection hole 175 in the ILD layer 170, the second gate insulation layer 150, and the first gate insulation layer 130 at a location corresponding to the two heavily doped areas 120b and 120c of the polysilicon layer 120;

depositing a source/drain wiring layer 180 on the ILD layer 170 and in the interlayer connection hole 175, and patterning the source/drain wiring layer 180;

coating an organic planarization layer 190 on the source/drain wiring layer 180, and patterning and curing the organic planarization layer 190; and depositing an anode wiring layer 200 on the organic planarization layer 190, and patterning the anode wiring layer 200.

The buffer layer 110, the first gate insulation layer 130, the second gate insulation layer 150, and the ILD layer 170 collectively constitute the at least one inorganic layer of the array substrate.

Figure 2:
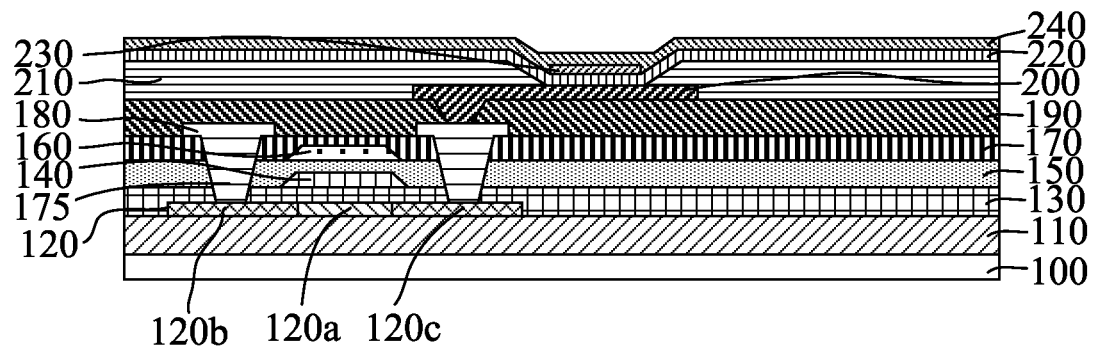

Next, as shown in FIG. 2, an OLED function layer is formed on the array substrate. The OLED function layer includes a first common layer 220, an organic light-emitting layer 230, and a second common layer 240 sequentially formed on the array substrate from bottom to top. In one embodiment of the present disclosure, the first common layer 220 includes a hole injection layer and a hole transportation layer sequentially formed from bottom to top; and the second common layer 240 includes an electron transportation layer, an electron injection layer, and an cathode sequentially formed from bottom to top. Preferably, the first common layer 220, the organic light-emitting layer 230, and the second common layer 240 are formed using deposition techniques. All of the second common layer 240, the organic light-emitting layer 230, the first common layer 220, the pixel defining layer 210, and the organic planarization layer 190 are made of organic material.

Figure 3:
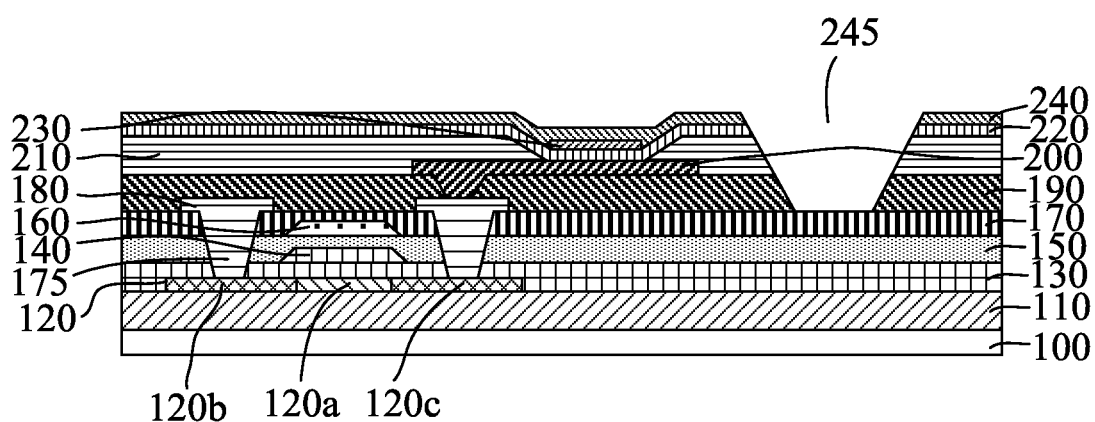

Then, as shown in FIG. 3, a first opening 245 is formed at a location near to the organic light-emitting layer 230 using a first laser, such that the first opening 245 passes through the second common layer 240, the first common layer 220, the pixel defining layer 210, and the organic planarization layer 190 of the array substrate. Preferably, the sidewall of the first opening 245 is inclined at an angle of 50-60 degrees counterclockwise from a horizontal plane.

Because the organic layers (including the second common layer 240, the first common layer 220, the pixel defining layer 210, and the organic planarization layer 190) are drilled by laser, it is needed to control depth of focus (DOF) of the first laser based on thicknesses of these organic layers, so as to achieve precise laser drilling. Moreover, since the areas cut and drilled by laser will be generally carbonized and burnt by laser as well, these areas have to be further cleaned by air knife to avoid occurrence of encapsulation failure.

Figure 4:
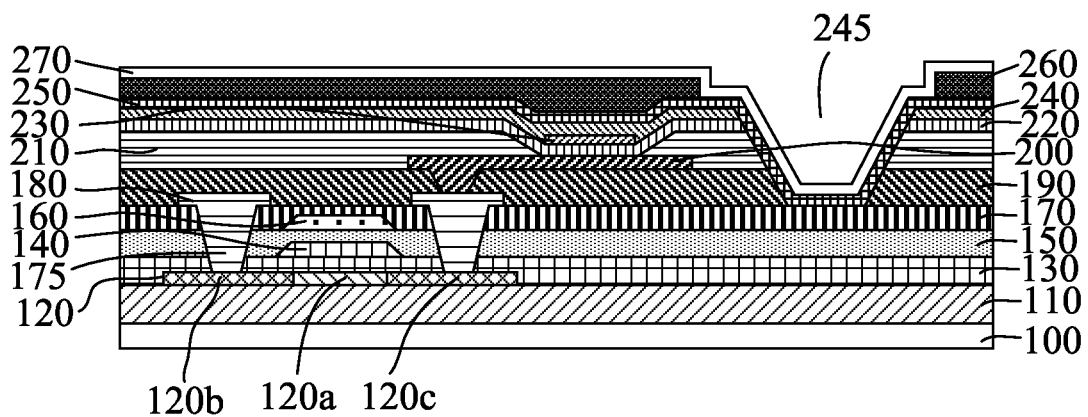

Thereafter, as shown in FIG. 4, a thin-film encapsulation layer is formed on the OLED function layer. The thin-film encapsulation layer includes at least one inorganic layer and at least one organic layer. In the present embodiment, the thin-film encapsulation layer includes a first inorganic layer 250, an organic layer 260, and a second inorganic layer 270, where the organic layer 260 is sandwiched between the first inorganic layer 250 and the second inorganic layer 270. The inorganic layers 250 and 270 of the thin-film encapsulation layer completely covers the organic light-emitting layer 230, such that the organic light-emitting layer 230 would not be exposed, ensuring that encapsulation failure does not occur. Preferably, the thin film encapsulation layer is formed using a chemical vapor deposition technique.

Figure 5:
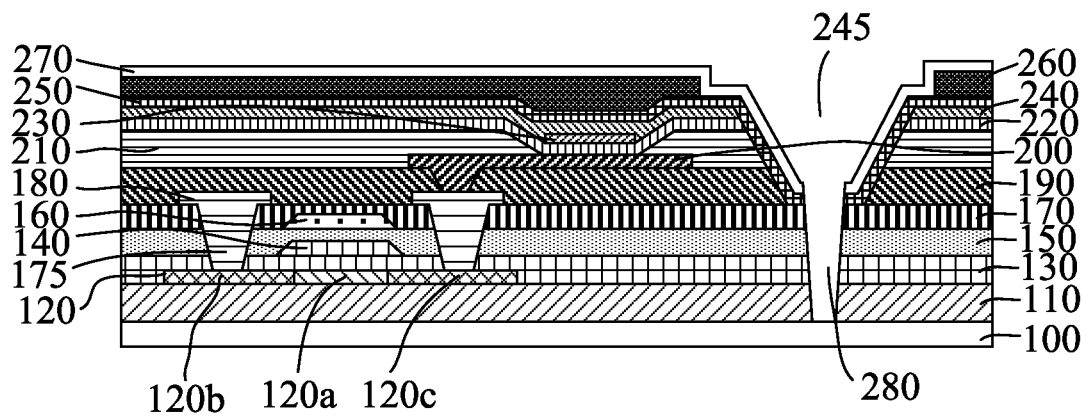

Further, as shown in FIG. 5, a second opening 280 is formed at a location corresponding to the first opening 245 using a dry etching technique, such that the second opening 280 passes through the inorganic layers 270 and 250 of the thin-film encapsulation layer and passes through the at least one inorganic layer (including the ILD layer 170, the second gate insulation layer 150, the first gate insulation layer 130, and the buffer layer 110) of the array substrate, and the second opening 280 is connected to the first opening 245.

Figure 6:
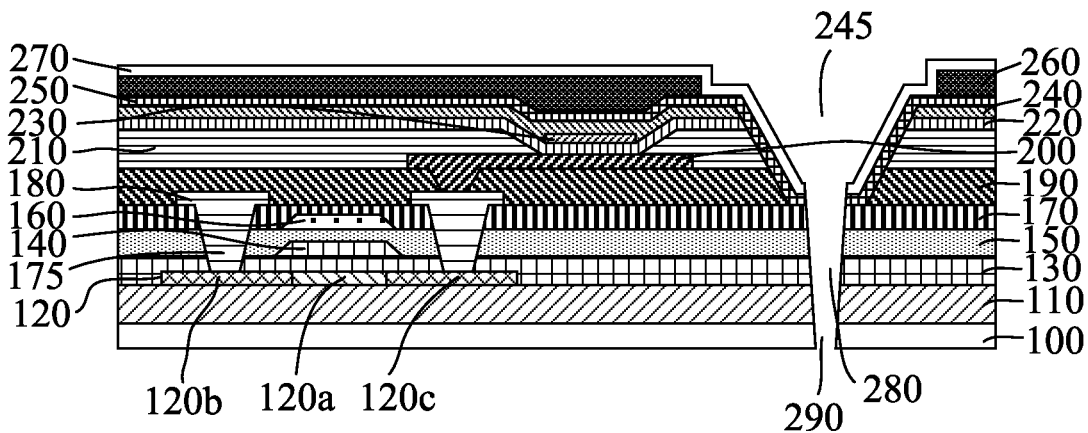

Finally, as shown in FIG. 6, a perforated hole 290 is formed in the baseplate 100 at a location corresponding to the second opening using a second laser, thereby producing a through-hole that includes the first opening 245, the second opening 280, and the perforated hole 290 in the OLED display panel. The first opening 245, the second opening 280, and the perforated hole 290 collectively constitute the through-hole in the OLED display panel. Preferably, the first laser and the second laser could be UV laser or $CO_2$ laser, and the first laser and the second laser can be same or different. After the through-hole is formed, the inorganic layers 250 and 270 completely covers the organic light-emitting layer 230, such that the organic light-emitting layer 230 would not be exposed, ensuring that encapsulation failure does not occur.

In addition, the present disclosure provides an organic light-emitting diode (OLED) display panel. Please see FIG. 6. The OLED display panel includes:

an array substrate, wherein the array substrate 100 includes a baseplate 100, and at least one inorganic layer, an organic planarization layer 190, and a pixel defining layer 210 sequentially disposed on the baseplate from bottom to top;

an OLED function disposed on the array substrate, wherein the OLED function layer includes a first common layer 220, an organic light-emitting layer 230, and a second common layer 240 sequentially disposed on the array substrate from bottom to top;

a thin-film encapsulation layer disposed on the OLED function layer, wherein an inorganic layer of the thin-film encapsulation layer completely covers the organic light-emitting layer 230; and a through-hole disposed at a location near to the organic light-emitting layer 230, wherein the through-hole passes through the inorganic layer of the thin-film encapsulation layer, the at least one inorganic layer of the array substrate, and the baseplate 100 of the array substrate.

Preferably, the baseplate 100 is made of an organic material. For example, the base plate 100 is a polyimide baseplate.

Preferably, OLED display panel further includes a thin film transistor (TFT) device disposed on the baseplate 100. Specifically, formation of the TFT device includes steps of:

depositing a buffer layer 110 on the baseplate 100;

depositing a polysilicon layer 120 on the buffer layer 110, and patterning the polysilicon layer 120;

performing a heavy doping treatment on two sides of the polysilicon layer 120, so as to form two heavily doped areas 120b and 120c;

depositing a first gate insulation layer 130 on the polysilicon layer 120;

depositing a first metal gate layer 140 on the first gate insulation layer 130, and patterning the first metal gate layer 140;

depositing a second gate insulation layer 150 on the first metal gate layer 140;

depositing a second metal gate layer 160 on the second gate insulation layer 150, and patterning the second metal gate layer 160;

depositing an interlayer dielectric (ILD) layer 170 on the second metal gate layer 160;

forming an interlayer connection hole 175 in the ILD layer 170, the second gate insulation layer 150, and the first gate insulation layer 130 at a location corresponding to the two heavily doped areas 120b and 120c of the polysilicon layer 120;

depositing a source/drain wiring layer 180 on the ILD layer 170 and in the interlayer connection hole 175, and patterning the source/drain wiring layer 180;

coating an organic planarization layer 190 on the source/drain wiring layer 180, and patterning and curing the organic planarization layer 190; and depositing an anode wiring layer 200 on the organic planarization layer 190, and patterning the anode wiring layer 200.

All of the second common layer 240, the organic light-emitting layer 230, the first common layer 220, the pixel defining layer 210, and the organic planarization layer 190 are made of organic material. The first common layer 220 includes a hole injection layer and a hole transportation layer sequentially formed from bottom to top; and the second common layer 240 includes an electron transportation layer, an electron injection layer, and an cathode sequentially formed from bottom to top.

According to the present disclosure, the second common layer 240, the organic light-emitting layer 230, the first common layer 220, the pixel defining layer 210, and the organic planarization layer 190 are all made of organic material. Moreover, the at least one inorganic layer (including the ILD layer 170, the second gate insulation layer 150, the first gate insulation layer 130, and the buffer layer 110) of the array substrate are all made of an inorganic material. And, the baseplate 100 is made of an organic material. The present disclosure provides a method for manufacturing an organic light-emitting diode (OLED) display panel, which includes using deposition techniques to form the first common layer, the organic light-emitting layer, and the second common layer first. Next, a first laser is used to form the first opening 245 in those layers made of organic material. Then, a deposition technique is used to form the thin film encapsulation layer on the substrate. Thereafter, a dry etching technique is used to form the second opening 280 in those layers made of an inorganic layer. Finally, a second laser is used to form the perforated hole 290 in the baseplate 100. Thereby, the through-hole that includes the first opening 245, the second opening 280, and the perforated hole 290 is produced in the OLED display panel. The subject invention ensures that the organic light-emitting layer 230 is completely covered by the inorganic layers 250 and 270 of the thin film encapsulation layer, and thus encapsulation failure does not occur. Therefore, according to the present disclosure, laser cutting and drilling is used and one additional dry etching step is further included in order to form a through-hole in the display panel. The manufacturing process of the present disclosure is simple.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing an organic light-emitting diode (OLED) display panel, comprising steps of:
    providing an array substrate comprising a baseplate, at least one inorganic layer, an organic planarization layer, and a pixel defining layer that are sequentially disposed from bottom to top;
    forming an OLED function layer on the array substrate, wherein the OLED function layer includes a first common layer, an organic light-emitting layer, and a second common layer sequentially formed on the array substrate from bottom to top, and the organic light-emitting layer is disposed on a portion of the first common layer;
    forming a first opening at a location near to the organic light-emitting layer using a first laser, wherein the first opening penetrates the second common layer, the first common layer, the pixel defining layer, and the organic planarization layer;
    forming a thin-film encapsulation layer comprising a first inorganic layer, an organic layer, and a second inorganic layer that are sequentially disposed from bottom to top, wherein the organic layer is correspondingly disposed above the remaining second common layer, and the first inorganic layer and the second inorganic layer completely surround the organic layer and completely cover the first opening;
    forming a second opening at a location corresponding to the first opening using a dry etching technique, wherein the second opening penetrates the second inorganic layer, the first inorganic layer, and the at least one inorganic layer of the array substrate, and the second opening is connected to the first opening; and
    forming a perforated hole penetrating the baseplate at a location corresponding to the second opening using a second laser, wherein the perforated hole is connected to the second opening.

2. The method for manufacturing the OLED display panel according to claim 1, wherein the baseplate is a polyimide baseplate.

3. The method for manufacturing the OLED display panel according to claim 1, wherein all of the baseplate, the second common layer, the first common layer, and the pixel defining layer are made of organic materials.

4. The method for manufacturing the OLED display panel according to claim 1, wherein the method further comprises:
    forming a thin film transistor (TFT) device on the baseplate.

5. The method for manufacturing the OLED display panel according to claim 1, wherein
    the first common layer includes a hole injection layer and a hole transportation layer sequentially formed from bottom to top; and
    the second common layer includes an electron transportation layer, an electron injection layer, and an cathode sequentially formed from bottom to top.

6. The method for manufacturing the OLED display panel according to claim 1, wherein
    the first common layer, the organic light-emitting layer, and the second common layer are formed using deposition techniques; and
    the thin film encapsulation layer is formed using a chemical vapor deposition technique.

7. An organic light-emitting diode (OLED) display panel, comprising:
    an array substrate comprising a baseplate, at least one inorganic layer, an organic planarization layer, and a pixel defining layer that are sequentially disposed from bottom to top, wherein the substrate is provided with a perforated hole;
    an OLED function disposed on the array substrate and comprising a first common layer, an organic light-emitting layer, and a second common layer that are sequentially disposed from bottom to top, wherein the organic light-emitting layer is disposed on a portion of the first common layer;
    a first opening located at a location near to the organic light-emitting layer and penetrating the second common layer, the first common layer, the pixel defining layer, and the organic planarization layer;
    a second opening penetrating the at least one inorganic layer of the array substrate and connected to the first opening and the perforated hole; and
    a thin-film encapsulation layer comprising a first inorganic layer, an organic layer, and a second inorganic layer that are sequentially disposed from bottom to top, wherein the organic layer is correspondingly disposed above the remaining second common layer, and the first inorganic layer and the second inorganic layer completely surround the organic layer and completely cover a sidewall of the first opening.

8. The OLED display panel according to claim 7, wherein the baseplate is a polyimide baseplate.

9. The OLED display panel according to claim 7, wherein all of the baseplate, the second common layer, the first common layer, and the pixel defining layer are made of organic materials.

10. The OLED display panel according to claim 7, wherein
    the first common layer includes a hole injection layer and a hole transportation layer sequentially disposed from bottom to top; and
    the second common layer includes an electron transportation layer, an electron injection layer, and an cathode sequentially disposed from bottom to top.

* * * * *